(12) United States Patent
Zhou et al.

(10) Patent No.: US 10,528,173 B2
(45) Date of Patent: Jan. 7, 2020

(54) ARRAY SUBSTRATE, DISPLAY PANEL, DISPLAY DEVICE AND METHOD FOR MANUFACTURING ARRAY SUBSTRATE

(71) Applicant: SHANGHAI TIANMA MICRO-ELECTRONICS CO., LTD., Shanghai (CN)

(72) Inventors: Zhiwei Zhou, Shanghai (CN); Qijun Yao, Shanghai (CN); Feng Lu, Shanghai (CN); Liang Liu, Shanghai (CN); Yan Shen, Shanghai (CN); Huafeng Bian, Shanghai (CN); Zhonglan Cai, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 108 days.

(21) Appl. No.: 15/862,594

(22) Filed: Jan. 4, 2018

(65) Prior Publication Data

US 2018/0129331 A1 May 10, 2018

(30) Foreign Application Priority Data

Jun. 30, 2017 (CN) .......................... 2017 1 0524267

(51) Int. Cl.
*G06F 3/041* (2006.01)
*H01L 27/12* (2006.01)
(Continued)

(52) U.S. Cl.
CPC ........ *G06F 3/0414* (2013.01); *G02F 1/13338* (2013.01); *G06F 3/0412* (2013.01);
(Continued)

(58) Field of Classification Search
CPC .... G06F 3/0414; G06F 3/0416; G06F 3/0412; G06F 3/04897; G06F 2203/04105;
(Continued)

(56) References Cited

U.S. PATENT DOCUMENTS

| 2017/0186778 A1* | 6/2017 | Miyake ............... H01L 27/1225 |
| 2017/0186843 A1* | 6/2017 | Hosaka ................. C04B 35/453 |
| 2017/0278874 A1* | 9/2017 | Yamazaki ........... H01L 27/1225 |

FOREIGN PATENT DOCUMENTS

CN 105511679 A 4/2016

* cited by examiner

*Primary Examiner* — Andrew Sasinowski
(74) *Attorney, Agent, or Firm* — Kilpatrick Townsend & Stockton, LLP

(57) ABSTRACT

Disclosed are an array substrate, a display panel, a display device and a method for manufacturing an array substrate. The array substrate includes a base substrate, comprising a display region and a non-display region surrounding the display region, and the display region of the base substrate is provided with a plurality of pixel units, with each of the pixel units comprising a thin-film transistor; and at least one pressure sensor, which is disposed on the non-display region of the base substrate, and the pressure sensor is disposed in the same layer and made of same materials with an active layer of the thin-film transistor, the active layer includes a channel region and a heavily doped region, and a square resistance of the pressure sensor is larger than that of the active layer.

16 Claims, 19 Drawing Sheets

(51) Int. Cl.
  *G02F 1/1333*    (2006.01)
  *G06F 3/0489*    (2013.01)
  *H01L 29/423*    (2006.01)

(52) U.S. Cl.
  CPC ........ *G06F 3/0416* (2013.01); *G06F 3/04897* (2013.01); *H01L 27/124* (2013.01); *H01L 29/42384* (2013.01)

(58) Field of Classification Search
  CPC . G06F 2203/04103; G06F 2203/04106; H01L 27/1288; H01L 27/1244; H01L 29/78696; H01L 27/124; H01L 29/42384; G02F 1/13338
  See application file for complete search history.

ARRAY SUBSTRATE, DISPLAY PANEL, DISPLAY DEVICE AND METHOD FOR MANUFACTURING ARRAY SUBSTRATE

CROSS-REFERENCE TO RELATED APPLICATIONS

This application claims priority to Chinese Patent Application No. 201710524267.4, filed on Jun. 30, 2017 and entitled "ARRAY SUBSTRATE, DISPLAY PANEL, DISPLAY DEVICE AND METHOD FOR MANUFACTURING ARRAY SUBSTRATE", the disclosure of which is incorporated herein by reference in its entirety.

BACKGROUND

At present, as an information inputting tool, display panels integrated with a touch function are widely applied to various electronic apparatuses such as mobile phones, tablet computers and information inquiry machines in public halls. As such, a user can operate on the electronic apparatus by just simply touching an icon on a display panel of the electronic apparatus using his finger, and hence there is no need to the user on other input apparatuses (for example, a keyboard and a mouse, etc.) and thus human-machine interaction is made simpler and easier.

For better meeting user expectations, usually a pressure sensor for detecting the magnitude of the touch pressure by which a user touches a display panel is disposed in a display panel. The pressure sensor can capture both information on a touch location and the magnitude of a touch pressure, thereby improving the application functionality of the touch technology.

In a related art, the touch sensor are generally located in a non-display region of the touch display panel, but the area of the touch sensor is generally large, which is not favorable for narrowing a frame of the display panel.

SUMMARY

The present disclosure provides an array substrate, a display panel, a display device and a method for manufacturing an array substrate in order to reduce the occupied area of the pressure sensor.

In a first aspect, embodiments of the disclosure provide an array substrate, which comprises: a base substrate, which includes a display region and a non-display region surrounding the display region; the display region of the base substrate is provided with a plurality of pixel units, with each of the pixel units including a thin-film transistor; and at least a pressure sensor, which is located on the non-display region of the base substrate, the pressure sensor is located in the same layer and made of same materials with an active layer of the thin-film transistor, the active layer includes a channel region and a heavily doped region, and a square resistance of the pressure sensor is larger than that of the heavily doped region of the active layer.

In a second aspect, embodiments of the disclosure further provide a display panel, which comprises the array substrate according to any of the embodiments of the disclosure.

In a third aspect, embodiments of the disclosure further provide a display device, which comprises the display panel according to any of the embodiments of the disclosure.

In a fourth aspect, embodiments of the disclosure provide a method for manufacturing an array substrate, which comprises: providing a base substrate which includes a display region and a non-display region surrounding the display region; forming a plurality of pixel units in the display region of the base substrate, and forming at least a pressure sensor in the non-display region of the base substrate, and each of the pixel units includes a thin-film transistor, the pressure sensor is located in the same layer and made of same materials with an active layer of the thin-film transistor, and a square resistance of the pressure sensor is larger than that of a heavily doped region of the active layer.

In the embodiments of the present disclosure, the square resistance of the pressure sensor is made to be larger than that of the heavily doped region of the active region, so that the square resistance of the pressure sensor is increased. Given the resistance of the pressure sensor, the area of the pressure sensor can be made smaller, thereby facilitating a narrow frame of the display device, and reducing the interference between signal lines within the non-display region of the array substrate.

DETAILED DESCRIPTION

The application will be illustrated in detail in conjunction with the drawings and embodiments. It may be understood that, the embodiments described here are only provided for explaining, rather than limiting, the application. Additionally, it further needs to be noted that, for convenient description, the drawings only show the parts related to the application rather than the whole structure.

Figure 1A:
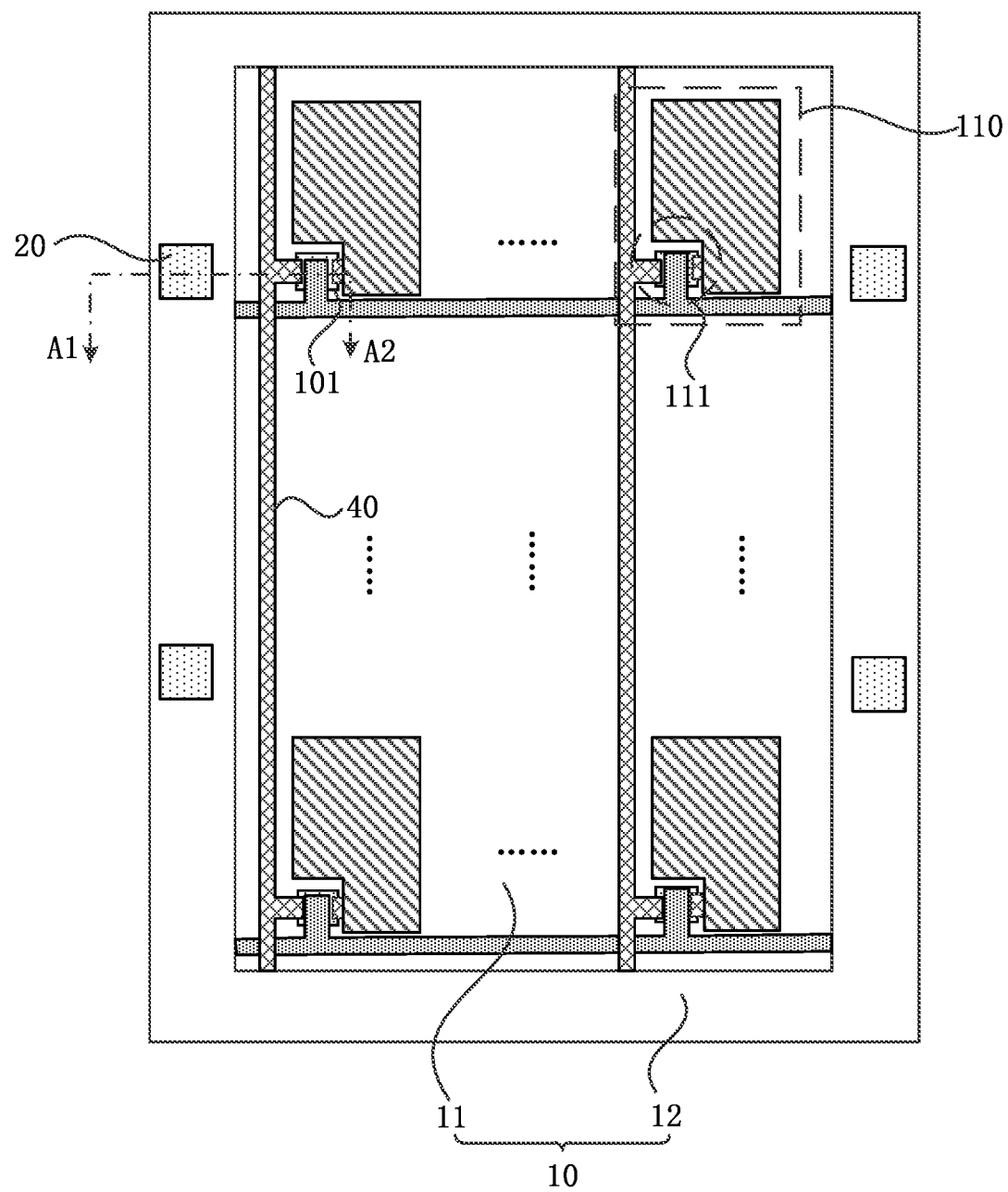
FIG. 1A is a schematic view of an array substrate according to an embodiment of the disclosure.
Figure 1B:
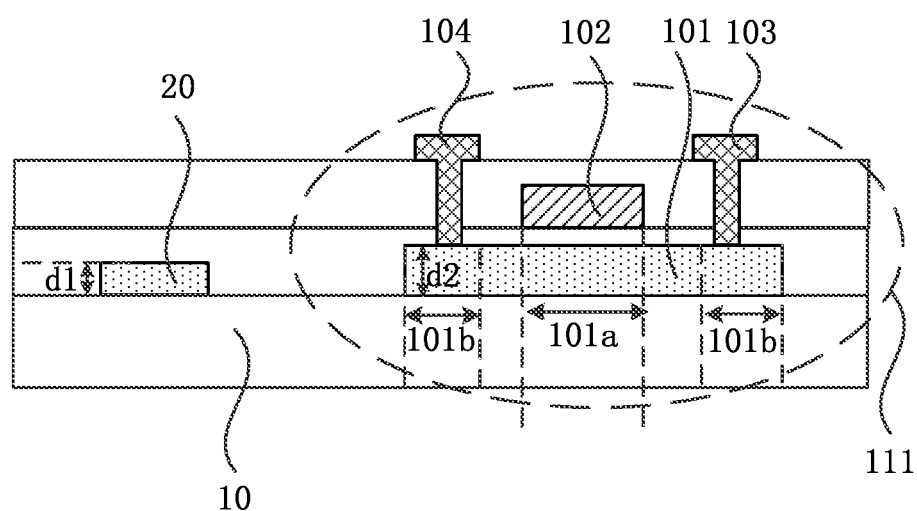
FIG. 1B is a schematic sectional view of an array substrate along a sectional line A1-A2.

An embodiment of the present disclosure provides an array substrate. FIG. 1A is a schematic view of an array substrate according to an embodiment of the disclosure, and FIG. 1B is a schematic sectional view of an array substrate along a sectional line A1-A2. Referring to FIGS. 1A and 1B, the array substrate includes: a base substrate 10, which includes a display region 11 and a non-display region 12 surrounding the display region; the display region 11 of the base substrate 10 is provided with a plurality of pixel units 110, with each of the pixel units 110 including a thin-film transistor; and at least a pressure sensor 20, which is located on the non-display region 12 of the base substrate 10, the pressure sensor 20 is located in the same layer and made of same materials with an active layer 101 of the thin-film transistor 111, the active layer 101 includes a channel region 101a and a heavily doped region 101b, and the square resistance of the pressure sensor 20 is provided to be larger than that of the heavily doped region 101b of the active layer. Here, the heavily doped region refers to a region in which the concentration of equilibrium major carriers is sharply increased, and hence the impurity concentration far exceeds the concentration of the intrinsic carriers, so that the conductivity of the semiconductor is enhanced, causing a high conductivity, a low resistivity, and a small resistance.

Figure 2:
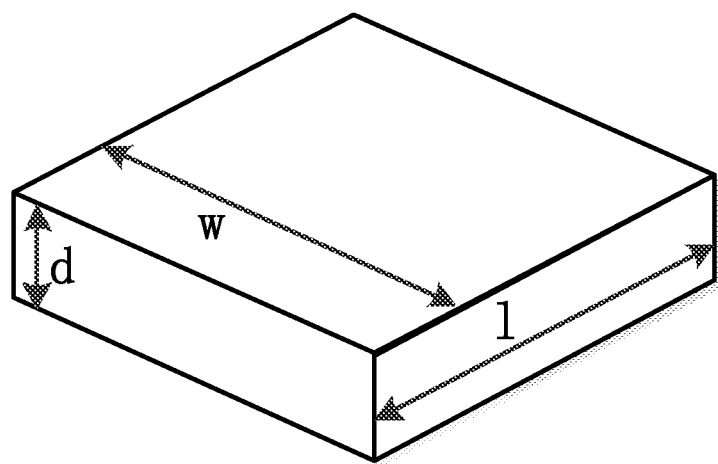
FIG. 2 is a schematic view showing a film conductive material according to an embodiment of the disclosure.

The thin-film transistor 111 includes a gate electrode 102, an active layer 101, a drain electrode 103, and a source electrode 104, and a channel region 101a of the active layer 101 is a region of the active layer 101 corresponding to the gate electrode 102, and a heavily doped region 101b of the active layer 101 is a region of the active layer 101 corresponding to the drain electrode 103 and the source electrode 104. As shown in FIG. In addition, the so-called "square resistance" refers to a resistance between the opposite edges (i.e., edge-to-edge) of a square shape of the film conductive material. FIG. 2 is a schematic view of a film conductive material according to an embodiment of the present disclosure. Referring to FIG. 2, assuming that the length of the film conductive material is 1, the width thereof is w, and the thickness thereof is d, then the resistance $R=\rho*l/(w*d)=(\rho/d)*(l/w)$. If $l=w$, then the square resistance $r=\rho/d$, where $\rho$ is the resistivity of the film conductive material.

In the related art, the pressure sensor 20 is typically formed in the same process as the active layer 101 of the thin-film transistor 111. The square resistance of the pressure sensor 20 is generally the same as the square resistance of the heavily doped region 101b of the active layer 101, resulting in a large area of the pressure sensor 20 under the given resistance thereof, which is not favorable for narrowing the frame of the display device. Further, a plurality of signal lines are generally located in the non-display region of the array substrate. Since the occupied area of the pressure sensor 20 is large, the area occupied by the signal lines have to be compressed so that the distance between the signal lines is shortened, resulting in short circuits or coupling.

In this embodiment, the square resistance of the pressure sensor 20 is provided to be larger than the heavily doped region 101b of the active layer 101, thereby increasing the square resistance of the pressure sensor 20. Given a certain resistance of the block-shaped pressure sensor 20, the ratio of the length to the width of the pressure sensor 20 may be made smaller. That is, given the width, the length may be made smaller, so that the area of the pressure sensor 20 may be reduced. For a pressure sensor 20 consisting of a plurality of inductive resistors, the ratio of the length to the width of each of the inductive resistors may be made smaller when the resistance of the inductive resistor is given, and the area of each of the inductive resistors may be made smaller, thereby reducing the area of the pressure sensor 20, facilitating the narrow frame of the display device, and reducing the interference between the signal lines in the non-display region of the array substrate.

In an embodiment, a thickness d1 of the pressure sensor 20 is smaller than a thickness d2 of the heavily doped region 101b of the active layer 101 in the direction perpendicular to the base substrate 10, as shown in FIG. 1B.

In an embodiment, given the resistivity of the pressure sensor 20, the resistance of the pressure sensor 20 is increased by reducing the thickness of the pressure sensor 20, thereby reducing the area of the pressure sensor 20, facilitating the narrow frame of the display device, and reducing the interference between the signal lines in the non-display region of the array substrate.

In an embodiment, the doping concentration of the pressure sensor 20 is less than the doping concentration of the heavily doped region 101b of the active layer 101.

In an embodiment, in the case that the thickness of the pressure sensor 20 is given, the doping concentration of the pressure sensor 20 is provided to be smaller than the doping concentration of the heavily doped region 101b of the active layer 101, so that the doping concentration of the pressure sensor 20 is reduced, and hence the electric conductivity of the pressure sensor 20 is reduced, i.e., the resistivity of the pressure sensor 20 is increased, thereby increasing the square resistance of the pressure sensor 20, reducing the area of the pressure sensor 20, and thus facilitating the narrow frame of the display device, and reducing the interference between the signal lines in the non-display region of the array substrate.

In an embodiment, the pressure sensor 20 and the active layer 101 may be made of polysilicon material. In an embodiment, the pressure sensor 20 may be P-type doped or N-type doped.

It is to be noted that the film thickness of the pressure sensor can be maintained to be same as the film thickness of the heavily doped region of the active layer, such that the square resistance of the pressure sensor is increased by only providing the doping concentration of the pressure sensor to be smaller than that of the heavily doped region. Alternatively, the doping concentration of the pressure sensor can be maintained to be same as that of the heavily doped region of the active layer, such that the square resistance of the pressure sensor is increased by only providing the film thickness of the pressure sensor to be smaller than the film thickness of the heavily doped region. Alternatively, the square resistance of the pressure sensor is increased by both providing the doping concentration of the pressure sensor to be smaller than that of the heavily doped region and providing the film thickness of the pressure sensor to be smaller than the film thickness of the heavily doped region, which are not specifically limited to the disclosure.

Figure 3:
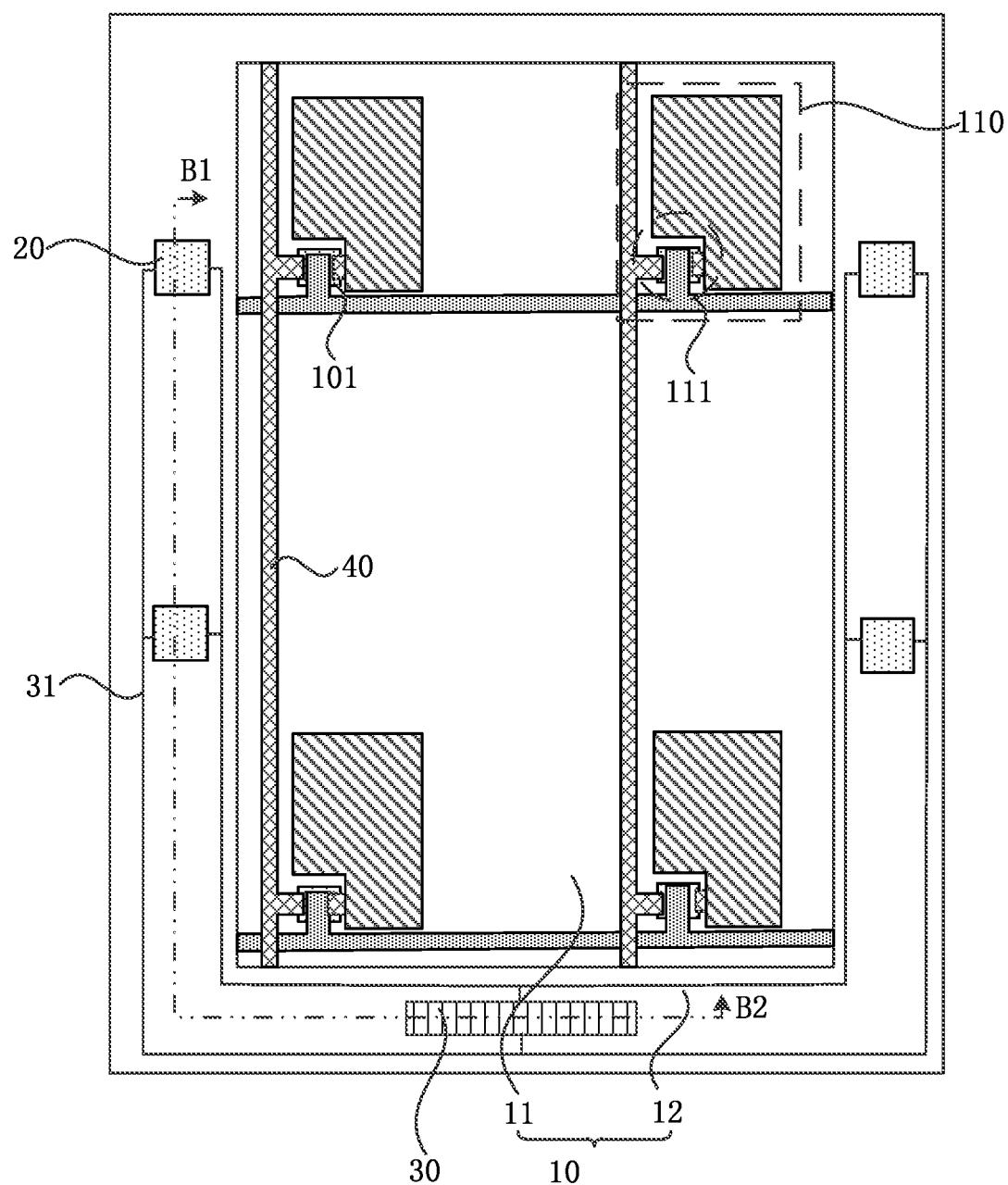
FIG. 3 is a schematic view of another array substrate according to an embodiment of the disclosure

FIG. 3 is a schematic view of another array substrate according to an embodiment of the present disclosure. In an embodiment, with reference to FIG. 3, the array substrate further comprises a drive circuit 30 for supplying a power supply drive signal to the pressure sensor 20.

The doping concentration of the pressure sensor 20 farther away from the drive circuit 30 is smaller than the doping concentration of the pressure sensor closer to the drive circuit 30.

In an embodiment, the drive circuit 30 is electrically connected to the pressure sensor 20 through a power supply signal line 31, for supplying the power supply drive signal to the pressure sensor 20. The power supply signal line 31 electrically connected to the pressure sensor 20 far away from the drive circuit 30 has a long length, so that the resistance thereof is large, resulting in a large voltage component of the power supply signal line 31, which affects the transmission of the power supply drive signal to the pressure sensor 20, thereby degrading the pressure detection accuracy of the pressure sensor 20. In this embodiment, the doping concentration of the pressure sensor 20 farther away from the drive circuit 30 is provided to be smaller than the doping concentration of the pressure sensor closer to the drive circuit 30, such that the square resistance of the pressure sensor 20 farther away from the drive circuit 30 is made larger, and hence the pressure sensor 20 farther away from the drive circuit 30 can still have a larger resistance when it has the same area with that of the pressure sensor 20 closer to the drive circuit 30 or even a smaller area, thereby increasing the voltage component of the pressure sensor 20, and hence ensuring that the strength of the power supply drive signal transmitted to the pressure sensor 20, so as to improve the pressure detection accuracy.

Figure 4:
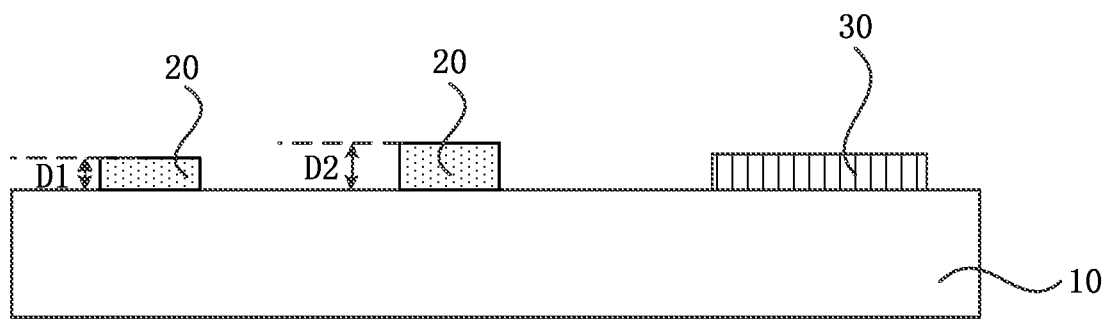
FIG. 4 is a schematic sectional view of the array substrate along a section line B1-B2.

FIG. 4 is a schematic cross-sectional view of the array substrate along the sectional line B1-B2. In an embodiment, with reference to FIGS. 3 and 4, the array substrate further includes a drive circuit 30 for supplying a power supply drive signal to the pressure sensor 20.

The thickness D1 of the pressure sensor 20 farther away from the drive circuit 30 is smaller than the thickness D2 of the pressure sensor 20 closer to the drive circuit 30, in the direction perpendicular to the base substrate 10.

In an embodiment, the thickness D1 of the pressure sensor 20 farther away from the drive circuit 30 is made to be smaller than the thickness D2 of the pressure sensor 20 closer to the drive circuit 30, such that the square resistance of the pressure sensor 20 farther away from the drive circuit 30 is made larger, and hence the pressure sensor 20 farther away from the drive circuit 30 can still have a large resistance when it has the same area with that of the pressure sensor 20 closer to the drive circuit 30 or even a smaller area, thereby increasing the voltage component of the pressure sensor 20, and hence ensuring that the strength of the power supply drive signal transmitted to the pressure sensor 20, so as to improve the pressure detection accuracy.

Figure 5:
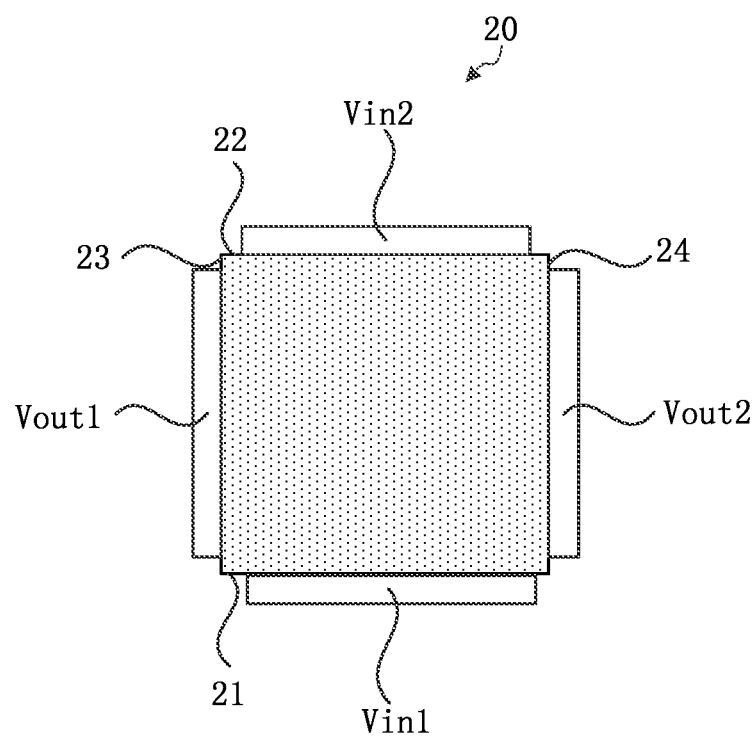
FIG. 5 is a schematic view of a pressure sensor according to an embodiment of the present disclosure.
Figure 6:
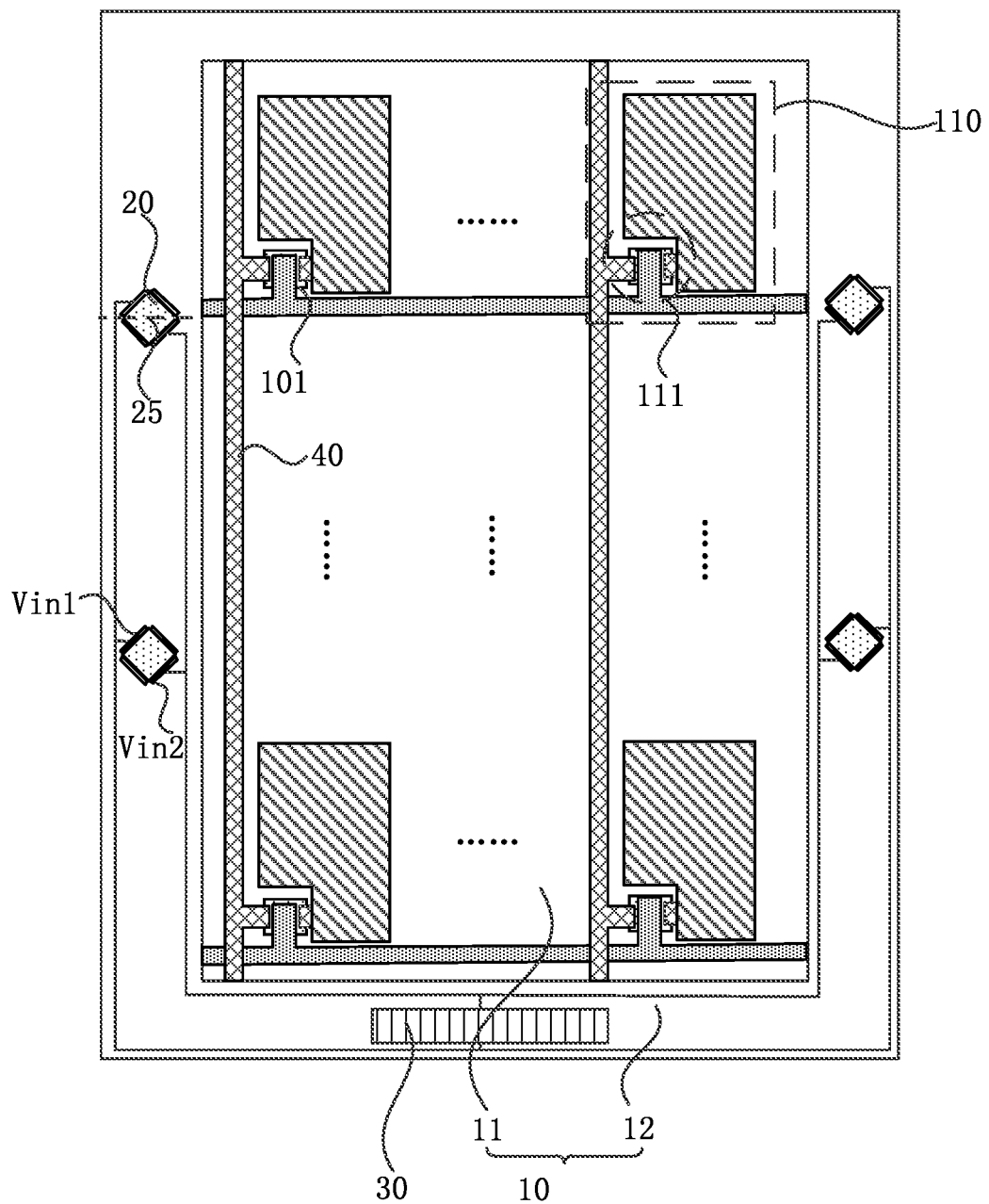
FIG. 6 is a schematic view of another array substrate according to an embodiment of the present disclosure.

FIG. 5 is a schematic view of a pressure sensor according to an embodiment of the present disclosure, and FIG. 6 is a schematic view of another array substrate according to an embodiment of the present disclosure. In an embodiment, with reference to FIGS. 5 and 6, the pressure sensor 20 is quadrilateral, and includes a first edge 21 and a second edge 22 opposite to each other, and a third edge 23 and a fourth edge 24 opposite to each other.

The pressure sensor 20 includes a first power supply signal inputting terminal Vin1 located on the first edge 21 and a second power supply signal inputting terminal Vin2 located on the second edge 22 for inputting a power supply drive signal to the pressure sensor 20.

The pressure sensor 20 further includes a first induction signal measuring terminal Vout1 located on the third edge 23 and a second induction signal measuring terminal Vout2 located on the fourth edge 24 for outputting a pressure induction detection signal from the pressure sensor 20.

In the specific application, after the drive circuit 30 applies the power supply drive signal to the pressure sensor 20 through the first power supply signal inputting terminal Vin1 and the second power supply signal inputting terminal Vin2, when the array substrate is pressed, the array substrate is deformed, the pressure sensor 20 is deformed correspondingly and the resistance of the pressure sensor 20 is changed, so that the difference between the first induction signal measuring terminal Vout1 the second induction signal measuring terminal Vout2 of the pressure sensor 20 is different from that without a press action. Thereby, the magnitude of the touch pressure can be determined.

In an embodiment, the array substrate also includes a plurality of data lines 40, wherein one of diagonal lines 25 of the pressure sensor 20 is perpendicular to the data lines 40.

In one embodiment, the angle between the diagonal line of the pressure sensor 20 and the data line 40 may affect the sensitivity of the pressure sensor 20 to recognize the magnitude of the touch pressure. In this embodiment, the diagonal line 25 of the pressure sensor 20 is made to be perpendicular to the data line 40, such that the pressure sensor 20 has a high sensitivity to recognize the magnitude of the touch pressure so as to ensure the pressure detection accuracy. In addition, the quadrangular pressure sensor 20 has two diagonal lines, and it is possible that either of the diagonal lines is perpendicular to the data line 40, which is not specifically limited.

Figure 7:
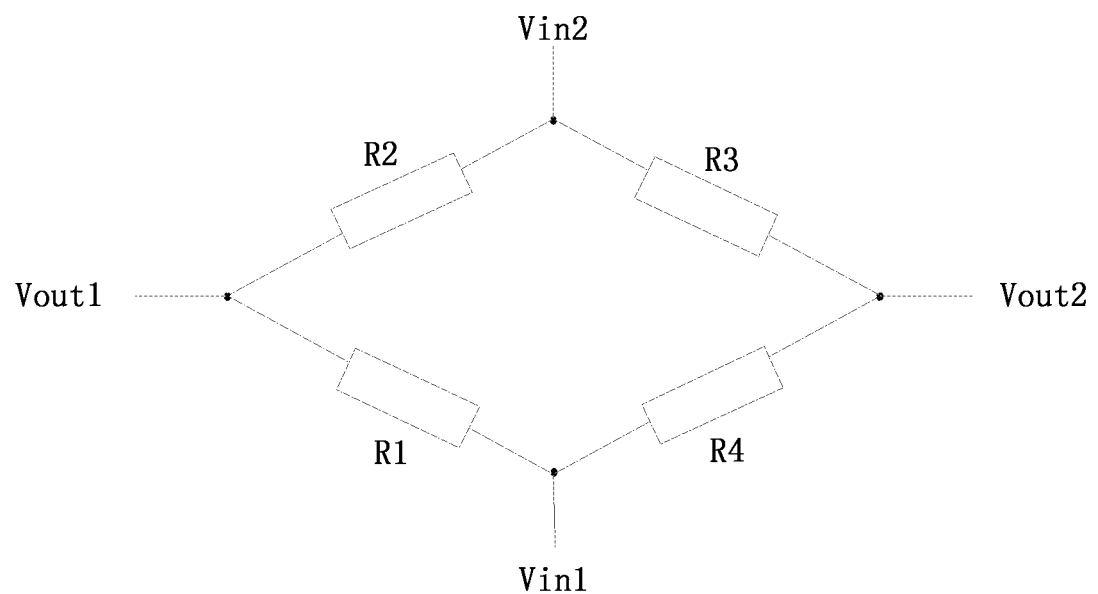
FIG. 7 is a schematic view of another pressure sensor according to an embodiment of the present disclosure.

FIG. 7 is a schematic view of another pressure sensor according to an embodiment of the present disclosure. In an embodiment, with reference to FIG. 7, the pressure sensor 20 includes a first inductive resistor R1, a second inductive resistor R2, a third inductive resistor R3, and a fourth inductive resistor R4.

A first terminal of the first inductive resistor R1 and a first terminal of the fourth inductive resistor R4 are electrically connected to the first power supply signal inputting terminal Vin1, a second terminal of the first inductive resistor R1 and a first terminal of the second inductive resistor R2 are electrically connected to the first induction signal measuring terminal Vout1, a second terminal of the fourth inductive resistor R4 and a first terminal of the third inductive resistor R3 are electrically connected to the second induction signal measuring terminal Vout2, and a second terminal of the second inductive resistor R2 and a second terminal of the third inductive resistor R3 are electrically connected to the second power supply signal inputting terminal Vin2.

The first power supply signal inputting terminal Vin1 and the second power supply signal inputting terminal Vin2 are used for inputting the power supply drive signal to the pressure sensor 20; and the first induction signal measuring terminal Vout1 and the second induction signal measuring terminal Vout2 are used for outputting the pressure induction detection signal from the pressure sensor 20.

In an embodiment, the first inductive resistor R1, the second inductive resistor R2, the third inductive resistor R3, and the fourth inductive resistor R4 constitute a Wheatstone bridge structure. When the power supply drive signal is input to the first power supply signal inputting terminal Vin1 and the second power supply signal inputting terminal Vin2, current passes through each branch in the Wheatstone bridge. When the array substrate is pressed, the pressure sensor 20 is subjected to the action of a shear force on the array substrate at the location corresponding to the pressure sensor 20, and hence the resistance of the resistors thereof (including the first inductive resistor R1, the second inductive resistor R2, the third inductive resistor R3, and the fourth inductive resistor R4) may change, so that the difference between the electrical signals outputted by the first induction signal measuring terminal Vout1 and the second induction signal measuring terminal Vout2 of the pressure sensor 20 may be different from that without a press action, and hence the magnitude of the touch pressure may be determined.

It is to be noted that since the Wheatstone bridge is disposed on the array substrate, and since the array substrate is deformed when pressure is applied thereto, the first inductive resistor R1, the second inductive resistor R2, the third inductive resistor R3 and the fourth inductive resistor R4 each are deformed. Hence, the first inductive resistor R1, the second inductive resistor R2, the third inductive resistor R3 and the fourth inductive resistor R4 may be to be able to sense different deformations in order to make a detection function on the magnitude of the touch pressure.

In an embodiment, the square resistance of the pressure sensor is made to be larger than the square resistance of the heavily doped region of the active layer, such that given the resistances of the first inductive resistor, the second inductive resistor, the third inductive resistor and the fourth inductive resistor, the area of each of the resistors can be made smaller, thereby reducing the area of the pressure sensor, facilitating the narrow frame of the display device, and reducing the interference between the signal lines in non-display region of the array substrate.

Figure 8A:
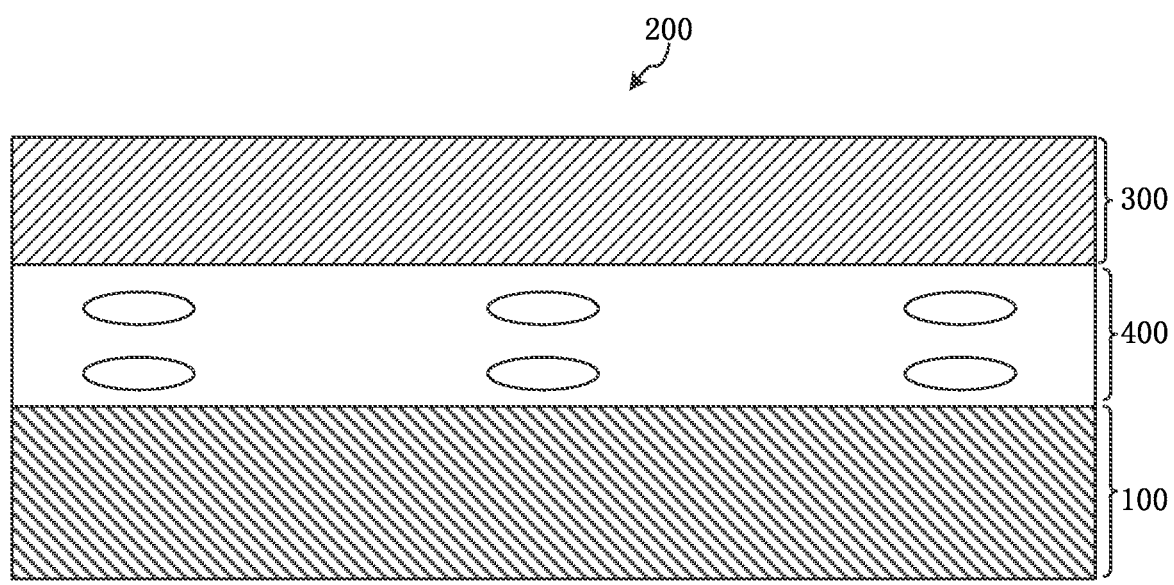
FIG. 8A is a schematic view of a display panel according to an embodiment of the present disclosure.

This embodiment also provides a display panel. FIG. 8A is a schematic view of a display panel according to an embodiment of the present disclosure. Referring to FIG. 8A, the display panel 200 may include the array substrate 100 as described in any of the embodiments of the present disclosure. Referring to FIG. 8A, the display panel 200 may be a liquid crystal display panel, and may include a color film substrate 300 disposed opposite to the array substrate 100, and a liquid crystal layer 400 between the array substrate 100 and the color film substrate 300.

Figure 8B:
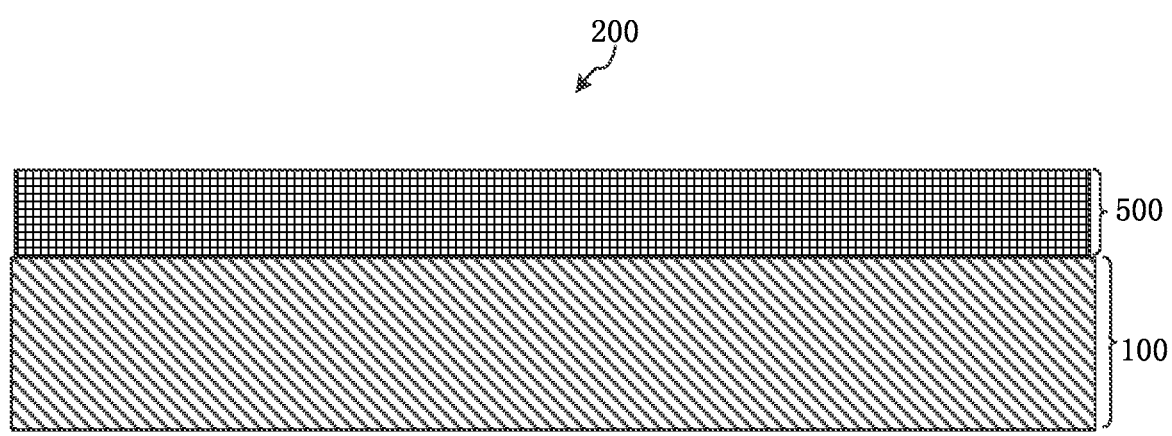
FIG. 8B is a schematic view of another display panel according to an embodiment of the present disclosure.

FIG. 8B is a schematic view of another display panel according to an embodiment of the present disclosure. Referring to FIG. 8B, the display panel 200 may also be an organic light-emitting display panel, and the display panel 200 further includes an encapsulation layer 500 disposed opposite to the array substrate 100.

Figure 9:
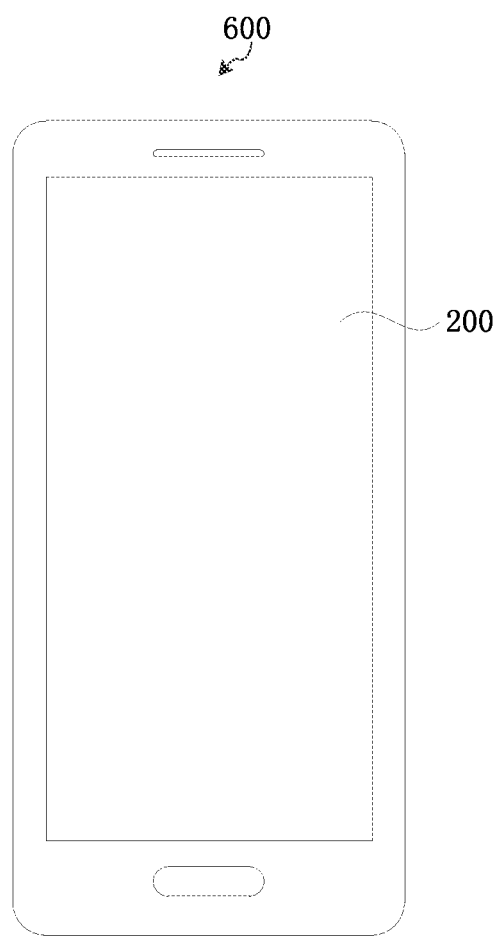
FIG. 9 is a schematic view of a display device according to an embodiment of the present disclosure.

This embodiment also provides a display device. FIG. 9 is a schematic view of a display device according to an embodiment of the present disclosure. Referring to FIG. 9, the display device 600 includes the display panel 200 according to any of the embodiments of the present disclosure.

Figure 10:
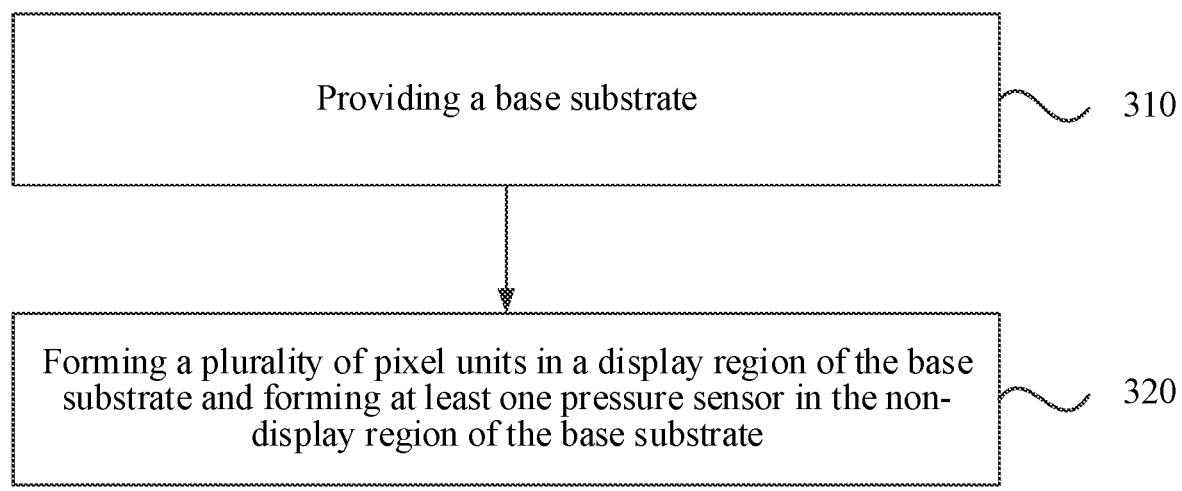
FIG. 10 is a flow chart of a method for manufacturing an array substrate according to an embodiment of the present disclosure.

FIG. 10 is a flow chart of a method for manufacturing an array substrate according to an embodiment of the present disclosure. Referring to FIG. 10, the method includes the following steps.

In step 310, a base substrate is provided, and the base substrate includes a display region and a non-display region surrounding the display region.

In step 320, a plurality of pixel units are formed in the display region of the base substrate, and at least one pressure sensor is formed in the non-display region of the base substrate.

Each of the pixel units includes a thin-film transistor, the pressure sensor is located in the same layer and made of same materials with an active layer of the thin-film transistor, and a square resistance of the pressure sensor is larger than that of a heavily doped region of the active layer.

In this embodiment, the square resistance of the pressure sensor is made to be larger than that of the heavily doped region of the active region, so that the square resistance of the pressure sensor is increased. Given the resistance of the pressure sensor, the area of the pressure sensor can be made smaller, thereby facilitating a narrow frame of the display device, and reducing the interference between signal lines within the non-display region of the array substrate.

In an embodiment, the active layer of the thin-film transistor is formed in the same process as the pressure sensor.

In an embodiment, with the configuration that the active layer of the thin-film transistor is formed in the same process as the pressure sensor, it is possible to eliminate the processes for a fabricating a silicon material film, thereby simplifying the fabrication process of the array substrate, and reducing the production cost.

Figure 11A:
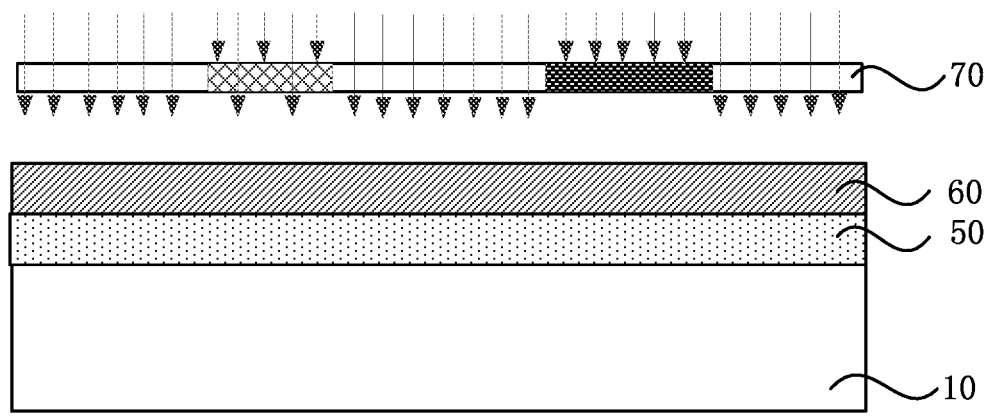
FIG. 11A is a schematic view of an exposure process according to an embodiment of the present disclosure.
Figure 11B:
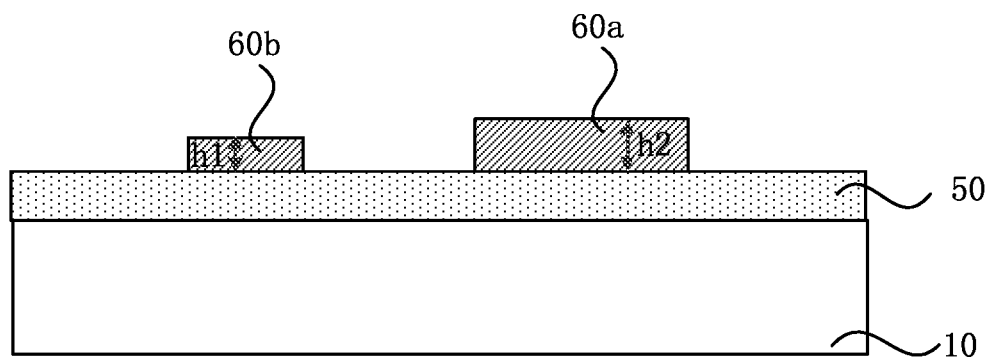
FIG. 11B is a schematic view of a developed photoresist layer according to an embodiment of the present disclosure.
Figure 11C:
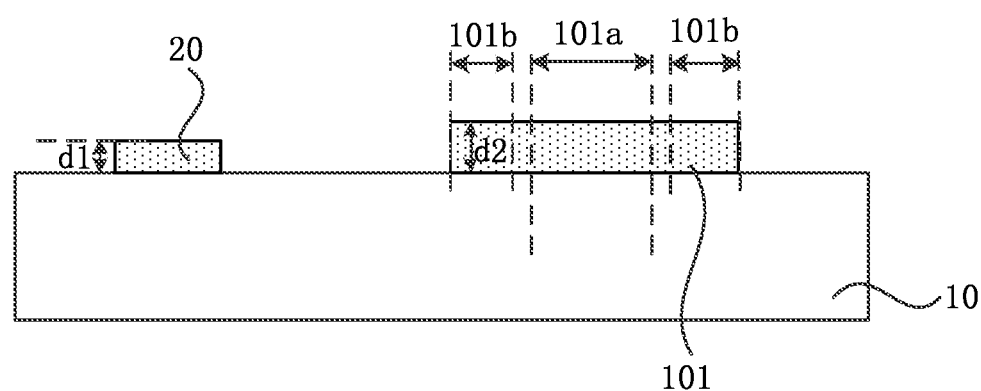
FIG. 11C is a schematic view of a pressure sensor and an active layer according to an embodiment of the present disclosure.

FIG. 11A is a schematic view of an exposure process according to an embodiment of the present disclosure, FIG. 11B is a schematic view of a developed photoresist layer according to an embodiment of the present disclosure, and FIG. 11C is a schematic view of a pressure sensor and an active source according to an embodiment of the present disclosure. Referring FIGS. 11A to 11C, the step of forming a plurality of pixel units in the display region of the base substrate and forming at least one pressure sensor in the non-display region of the base substrate may include the steps of: forming a semiconductor layer 50, and the semiconductor layer 50 covers the base substrate 10; forming a photoresist layer 60 on the side of the semiconductor layer 50 away from the base substrate 10; exposing, with a halftone masking process, and developing the photoresist layer 60, so that a thickness h2 of the photoresist layer 60*a* remaining in the region corresponding to the heavily doped region of the active layer is larger than a thickness h1 of the photoresist layer 60*b* remaining in the region corresponding to the pressure sensor 20, in the direction perpendicular to the base substrate 10; and etching the semiconductor layer 50 and the remained photoresist layers 60*a* and 60*b* so that after the etching, a thickness of the pressure sensor 20 is smaller than a thickness of the heavily doped region 101*b* of the active layer 101 in the direction perpendicular to the base substrate 10.

In an embodiment, in the halftone masking process, the photoresist layer 60 is exposed with the halftone mask 70 so that after being developed, the photoresist layer 60 may form a pattern having different thicknesses, and with the configuration that the thickness h2 of the photoresist layer 60*a* remaining in the region corresponding to the heavily doped region 101*b* of the active layer 101 is larger than the thickness h1 of the photoresist layer 60*b* remaining in the region corresponding to the pressure sensor 20, the etched thickness of the semiconductor layer 50 in the region corresponding to the pressure sensor 20 is larger than the etched thickness of the semiconductor layer 50 in the region corresponding to the heavily doped region 101*b*. That is, the thickness of the formed pressure sensor 20 is smaller than the thickness of the heavily doped region 101*b* of the active layer 101.

By using a halftone masking process, the thickness of the pressure sensor is smaller than the thickness of the heavily doped region formed in the same process, resulting in a large square resistance of the pressure sensor, which on the one hand, reduce the process steps and hence reduces the process cost, and on the other hand, reduces the area of the pressure sensor in order to facilitate the narrow frame of the display device and reduce the interference between signal lines within the non-display region of the array substrate.

It should be noted that this embodiment illustrates only the steps of forming the pressure sensor and the active layer, and the process steps for forming the other film layers of the pixel unit are similar to those in the related art and hence are not specifically described herein. In addition, the thickness of the channel region of the active layer in this embodiment is not specifically limited. FIGS. 11A to 11C merely illustrate the thickness of the entire active layer is the same, but is not limited to the present disclosure.

Figure 11D:
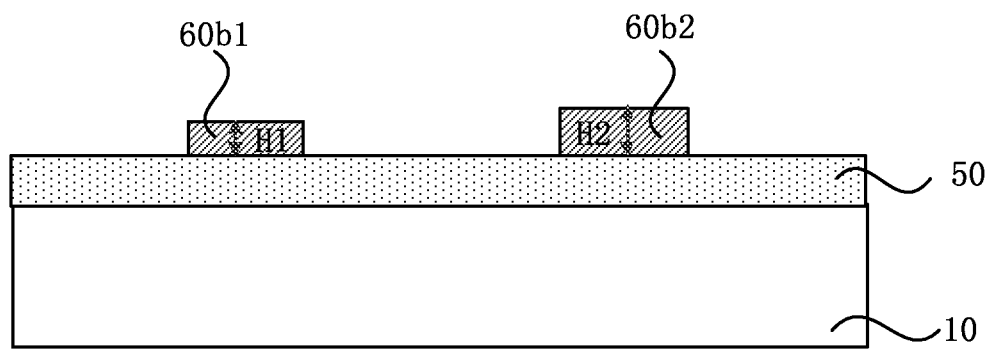
FIG. 11D is a schematic view of another developed photoresist layer according to an embodiment of the present disclosure.

FIG. 11D is a schematic view of another developed photoresist layer according to an embodiment of the present disclosure. In an embodiment, with reference to FIG. 11D, the array substrate further includes a drive circuit for supplying a power supply drive signal to the pressure sensor; and when forming a plurality of pixel units in the display region of the base substrate and forming at least one pressure sensor in the non-display region of the base substrate, the method further includes: exposing, with the halftone masking process, and developing the photoresist layer so that the thickness H1 of the photoresist layer 60b1 remaining in the region corresponding to the pressure sensor farther away from the drive circuit is smaller than the thickness H1 of the photoresist layer 60b2 remaining in the region corresponding to the pressure sensor closer to the drive circuit, in the direction perpendicular to the base substrate 10; etching the semiconductor layer and the remained photoresist layers 60b1 and 60b2 so that after the etching, the thickness of the pressure sensor farther away from the drive circuit is smaller than the thickness of the pressure sensor closer to the drive circuit, in the direction perpendicular to the base substrate 10.

Figure 12A:
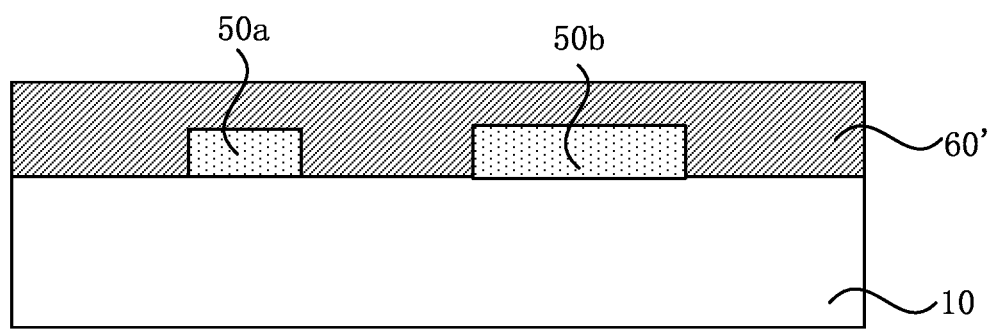
FIG. 12A is a schematic view of a patterned semiconductor layer and a photoresist layer according to an embodiment of the present disclosure.
Figure 12B:
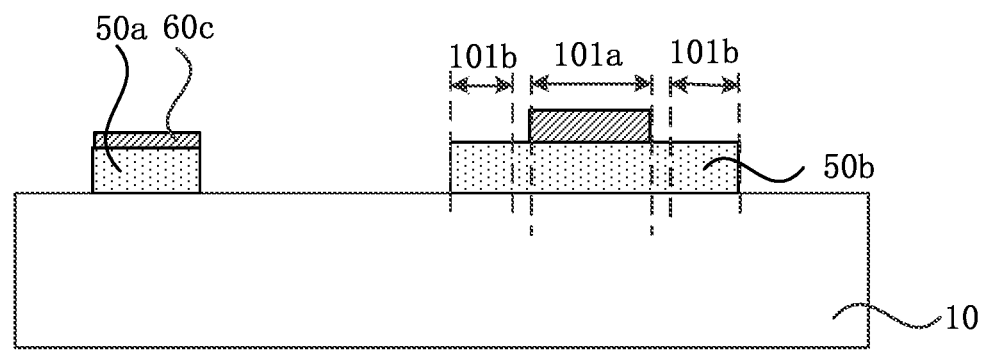
FIG. 12B is a schematic view of another developed photoresist layer according to an embodiment of the present disclosure.

In an embodiment, the thickness of the pressure sensor farther away from the drive circuit is made to be smaller than the thickness of the pressure sensor closer to the drive circuit, so that the square resistance of the pressure sensor farther away from the drive circuit is larger, and hence the pressure sensor farther away from the drive circuit can still have a larger resistance when it has the same area with that of the pressure sensor closer to the drive circuit or even a smaller area, thereby increasing the voltage component of the pressure sensor, and hence ensuring that the strength of the power supply drive signal transmitted to the pressure sensor, so as to improve the pressure detection accuracy FIG. 12A is a schematic view of a patterned semiconductor layer and a photoresist layer according to an embodiment of the present disclosure, and FIG. 12B is a schematic view of another developed photoresist layer according to an embodiment of the present disclosure. Referring to FIGS. 12A and 12B, the step of forming a plurality of pixel units in the display region of the base substrate and forming at least one pressure sensor in the non-display region of the base substrate includes: forming a semiconductor layer, and the semiconductor layer covers the base substrate 10; patterning the semiconductor layer, to form a semiconductor pattern 50a corresponding to the pressure sensor and a semiconductor pattern 50b corresponding to the active layer; forming a photoresist layer 60' on the side of the semiconductor layer away from the base substrate 10; exposing, with a halftone masking process, and developing the photoresist layer 60' so that the thickness of the photoresist layer remaining in the region corresponding to the heavily doped region 101b of the active layer is smaller than the thickness of the photoresist layer 60c remaining in the region corresponding to the pressure sensor; and doping the patterned semiconductor layers 50a and 50b so that after the doping, a doping concentration of the pressure sensor is smaller than a doping concentration of the heavily doped region of the active layer.

In an embodiment, the photoresist layer is not remained in the heavily doped region 101b in the actual doping process, that is, the thickness of the photoresist layer remaining in the region corresponding to the heavily doped region 101b is zero. The thickness of the photoresist layer 60c remaining in the region corresponding to the pressure sensor can be set according to the actual doping concentration, and is not specifically limited. In the doping process, because of the blocking of the photoresist layer 60c, the doping amount of the semiconductor pattern 50a corresponding to the pressure sensor is smaller than the doping amount of the semiconductor layer corresponding to the heavily doped region 101b, thereby increasing the square resistance of the pressure sensor.

It should be noted that this embodiment illustrates only the steps of forming the pressure sensor and the active layer, and the process steps for forming the other film layers of the pixel unit are similar to those in the related art and hence are not specifically described herein. In addition, the active layer may also include lightly doped regions between the channel region and the heavily doped region, which merely exemplifies the thickness of the photoresist layer remaining on the lightly doped region and the channel region, but are not intended to limit the disclosure.

In addition, in order to reduce the difficulty of the process, the first power supply signal inputting terminal, the second power supply signal inputting terminal, the first induction signal measuring terminal and the second induction signal measuring terminal on the edges of the pressure sensor may have the same doping concentration with that of heavily doped region of the active layer.

Figure 12C:
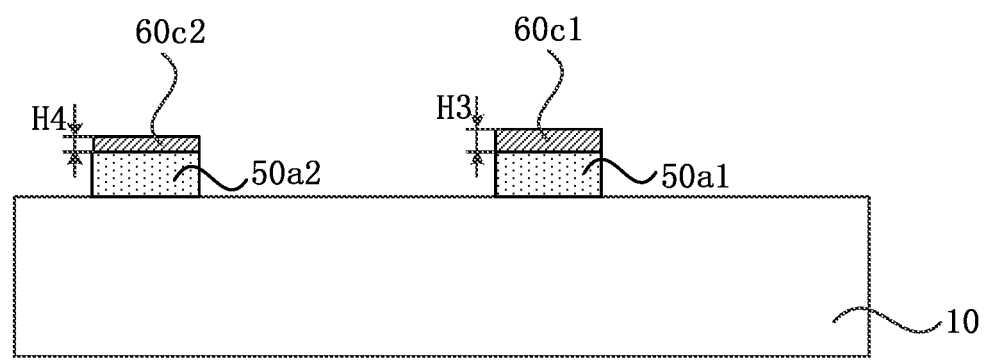
FIG. 12C is a schematic view of another developed photoresist layer according to the embodiment of the present disclosure.

FIG. 12C is a schematic view of another developed photoresist layer according to an embodiment of the present disclosure. In an embodiment, with reference to FIG. 12C, the array substrate further includes a drive circuit for supplying a power supply drive signal to the pressure sensor, and when forming a plurality of pixel units in a display region of the base substrate and forming at least one pressure sensor in the non-display region of the base substrate, the method further includes: exposing, with a halftone masking process, and developing the photoresist layer so that a thickness H3 of the photoresist layer 60c1 remaining in the region corresponding to the pressure sensor farther away from the drive circuit is larger than a thickness H4 of the photoresist layer 60c2 remaining in the region corresponding to the pressure sensor closer to the drive circuit; and doping the patterned semiconductor layer so that after the doping, the doping concentration of the pressure sensor farther away from the drive circuit is smaller than the doping concentration of the pressure sensor closer to the drive circuit.

In the doping process, the doping amount of the semiconductor pattern 50a1 corresponding to the pressure sensor farther away from the drive circuit is smaller than that of the semiconductor pattern 50a2 corresponding to the pressure sensor closer to the drive circuit due to the blocking of the photoresist layers 60c1 and 60c2, so that after the doping, the doping concentration of the pressure sensor farther away from the drive circuit is smaller than the doping concentration of the pressure sensor closer to the drive circuit, and thus the square resistance of the pressure sensor farther away from the drive circuit is larger, and hence the pressure sensor farther away from the drive circuit can still have a larger resistance when it has the same area with that of the pressure sensor closer to the drive circuit or even a smaller area, thereby increasing the voltage component of the pressure sensor, and hence ensuring the strength of the power supply drive signal transmitted to the pressure sensor, so as to improve the pressure detection accuracy.

It should be noted that the embodiments of the present disclosure and the technical principles used therein are described as above. It will be appreciated that the disclosure is not limited to the embodiments described herein, and any apparent alterations, modification and substitutions can be made without departing from the scope of protection of the disclosure. Accordingly, while the disclosure is described in detail through the above embodiments, the disclosure is not limited to the above embodiments and can further include other additional embodiments without departing from the concept of the disclosure.

What is claimed is:

1. A display panel, comprising:
   an array substrate, wherein the array substrate comprises:
   a base substrate, comprising:
   a display region and a non-display region surrounding the display region, wherein the display region of the base substrate is provided with a plurality of pixel units, with each of the pixel units comprising a thin-film transistor; and
   at least one pressure sensor, which is disposed on the non-display region of the base substrate, wherein the pressure sensor is disposed in the same layer and made of same materials with an active layer of the thin-film transistor,
   wherein the active layer comprises:
   a channel region and a heavily doped region, and a square resistance of the pressure sensor is larger than a square resistance of the heavily doped region of the active layer.

2. The display panel as claimed in claim 1, wherein a thickness of the pressure sensor is less than a thickness of the heavily doped region of the active layer in the direction perpendicular to the base substrate.

3. The display panel as claimed in claim 1, wherein a doping concentration of the pressure sensor is less than a doping concentration of the heavily doped region of the active layer.

4. The display panel as claimed in claim 2, further comprising:
   a drive circuit for supplying a power supply drive signal to the pressure sensor, and
   wherein the thickness of the pressure sensor farther away from the drive circuit is less than the doping concentration of the thickness closer to the drive circuit, in the direction perpendicular to the base substrate.

5. The display panel as claimed in claim 3, further comprising:
   a drive circuit for supplying a power supply drive signal to the pressure sensor, and
   wherein the doping concentration of the pressure sensor farther away from the drive circuit is less than the doping concentration of the pressure sensor closer to the drive circuit.

6. The display panel as claimed in claim 3, wherein the pressure sensor comprises a P-type doped material or a N-type doped material.

7. The display panel as claimed in claim 1, wherein the pressure sensor is a quadrilateral and has a first edge and a second edge opposite to each other, and has a third edge and a fourth edge opposite to each other,
   the pressure sensor comprises a first power supply signal inputting terminal on the first edge and a second power supply signal inputting terminal on the second edge for inputting a power supply drive signal to the pressure sensor, and
   the pressure sensor further comprises a first induction signal measuring terminal on the third edge and a second induction signal measuring terminal on the fourth edge for outputting a pressure induction detection signal from the pressure sensor.

8. The display panel as claimed in claim 7, further comprising:
   a plurality of data lines, wherein one of diagonal lines of the pressure sensor is perpendicular to the data lines.

9. The display panel as claimed in claim 1, wherein
   the pressure sensor comprises a first inductive resistor, a second inductive resistor, a third inductive resistor, and a fourth inductive resistor, and
   wherein a first terminal of the first inductive resistor and a first terminal of the fourth inductive resistor are electrically connected to the first power supply signal inputting terminal,
   a second terminal of the first inductive resistor and a first terminal of the second inductive resistor are electrically connected to the first induction signal measuring terminal,
   a second terminal of the fourth inductive resistor and a first terminal of the third inductive resistor are electrically connected to the second induction signal measuring terminal,
   and a second terminal of the second inductive resistor and a second terminal of the third inductive resistor are electrically connected to the second power supply signal inputting terminal; and
   the first power supply signal inputting terminal and the second power supply signal inputting terminal are configured to input the power supply drive signal to the pressure sensor,
   and the first induction signal measuring terminal and the second induction signal measuring terminal are configured to output the pressure induction detection signal from the pressure sensor.

10. The display panel as claimed in claim 1, wherein the pressure sensor and the active layer comprise a polysilicon material.

11. A method for manufacturing a display panel, which comprises:
    providing a base substrate comprising a display region and a non-display region surrounding the display region;
    forming a plurality of pixel units in the display region of the base substrate and forming at least one pressure sensor in the non-display region of the base substrate,
    wherein each of the pixel units comprises a thin-film transistor, the pressure sensor is disposed in the same layer and made of same materials with an active layer of the thin-film transistor, and a square resistance of the pressure sensor is larger than a square resistance of a heavily doped region of the active layer.

12. The method as claimed in claim 11, wherein the active layer of the thin-film transistor is formed in the same process as the pressure sensor.

13. The method as claimed in claim 11, wherein the forming a plurality of pixel units in the display region of the base substrate and forming at least one pressure sensor in the non-display region of the base substrate comprises:

forming a semiconductor layer, wherein the semiconductor layer covers the base substrate;

forming a photoresist layer on the side of the semiconductor layer away from the base substrate;

exposing, with a halftone masking process, and developing the photoresist layer, so that a thickness of the photoresist layer remaining in the region corresponding to the heavily doped region of the active layer is larger than a thickness of the photoresist layer remaining in the region corresponding to the pressure sensor, in the direction perpendicular to the base substrate; and etching the semiconductor layer and the remained photoresist layers so that after the etching, a thickness of the pressure sensor is less than a thickness of the heavily doped region of the active layer in the direction perpendicular to the base substrate.

14. The method as claimed in claim 13, wherein the array substrate further comprises a drive circuit for supplying a power supply drive signal to the pressure sensor; and when forming a plurality of pixel units in the display region of the base substrate and forming at least one pressure sensor in the non-display region of the base substrate, the method further comprises:

exposing, with the halftone masking process, and developing the photoresist layer so that the thickness of the photoresist layer remaining in the region corresponding to the pressure sensor farther away from the drive circuit is less than the thickness of the photoresist layer remaining in the region corresponding to the pressure sensor closer to the drive circuit, in the direction perpendicular to the base substrate; and etching the semiconductor layer and the remained photoresist layers so that after the etching, the thickness of the pressure sensor farther away from the drive circuit is less than the thickness of the pressure sensor closer to the drive circuit, in the direction perpendicular to the base substrate.

15. The method as claimed in claim 11, wherein forming a plurality of pixel units in the display region of the base substrate and forming at least one pressure sensor in the non-display region of the base substrate comprises:

forming a semiconductor layer, wherein the semiconductor layer covers the base substrate;

patterning the semiconductor layer;

forming a photoresist layer on the side of the semiconductor layer away from the base substrate;

exposing, with a halftone masking process, and developing the photoresist layer so that a thickness of the photoresist layer remaining in the region corresponding to the heavily doped region of the active layer is less than a thickness of the photoresist layer remaining in the region corresponding to the pressure sensor; and doping the patterned semiconductor layers and so that after the doping, a doping concentration of the pressure sensor is less than a doping concentration of the heavily doped region of the active layer.

16. The method as claimed in claim 15, wherein the array substrate further comprises a drive circuit for supplying a power supply drive signal to the pressure sensor, and when forming a plurality of pixel units in a display region of the base substrate and forming at least one pressure sensor in the non-display region of the base substrate, the method further comprises:

exposing, with a halftone masking process, and developing the photoresist layer so that the thickness of the photoresist layer remaining in the region corresponding to the pressure sensor farther away from the drive circuit is larger than the thickness of the photoresist layer remaining in the region corresponding to the pressure sensor closer to the drive circuit; and doping the patterned semiconductor layer so that after the doping, the doping concentration of the pressure sensor farther away from the drive circuit is less than the doping concentration of the pressure sensor closer to the drive circuit.

* * * * *